United States Patent
Likhanskii et al.

(10) Patent No.: US 10,665,415 B1
(45) Date of Patent: May 26, 2020

(54) APPARATUS AND METHOD FOR CONTROLLING ION BEAM PROPERTIES USING ELECTROSTATIC FILTER

(71) Applicant: APPLIED Materials, Inc., Santa Clara, CA (US)

(72) Inventors: Alexandre Likhanskii, Malden, MA (US); Frank Sinclair, Boston, MA (US); Shengwu Chang, South Hamilton, MA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/182,220

(22) Filed: Nov. 6, 2018

(51) Int. Cl.
*H01J 37/05* (2006.01)
*H01J 37/317* (2006.01)

(52) U.S. Cl.
CPC .......... *H01J 37/05* (2013.01); *H01J 37/3171* (2013.01); *H01J 2237/057* (2013.01)

(58) Field of Classification Search
CPC ..... H01J 37/05; H01J 37/3171; H01J 2237/05
USPC ................................ 250/396 R, 492.1–492.3
See application file for complete search history.

(56) References Cited

U.S. PATENT DOCUMENTS

| 7,888,653 | B2* | 2/2011 | Kellerman | H01J 37/12 250/396 R |
| 9,293,295 | B2* | 3/2016 | Yagita | H01J 37/147 |
| 9,978,556 | B2* | 5/2018 | Lee | H01J 37/08 |
| 2009/0314932 | A1* | 12/2009 | Benveniste | H01J 37/3171 250/252.1 |
| 2015/0228454 | A1* | 8/2015 | Kato | H01J 37/3171 250/396 ML |
| 2015/0279612 | A1* | 10/2015 | Yagita | H01J 37/147 250/396 R |

\* cited by examiner

*Primary Examiner* — Michael Maskell

(57) ABSTRACT

An apparatus and method are provided. In one embodiment, an apparatus may include a main chamber, where the main chamber includes an electrode assembly. The electrode assembly may include a plurality of electrodes arranged between a chamber entrance and a chamber exit of the main chamber. The apparatus may include a beam tunnel, connected to the chamber entrance, configured to conduct an ion beam to the main chamber; and an electrostatic tuner, disposed in the beam tunnel, the electrostatic tuner comprising at least one tuner electrode, independently coupled to a tuner voltage assembly.

19 Claims, 5 Drawing Sheets

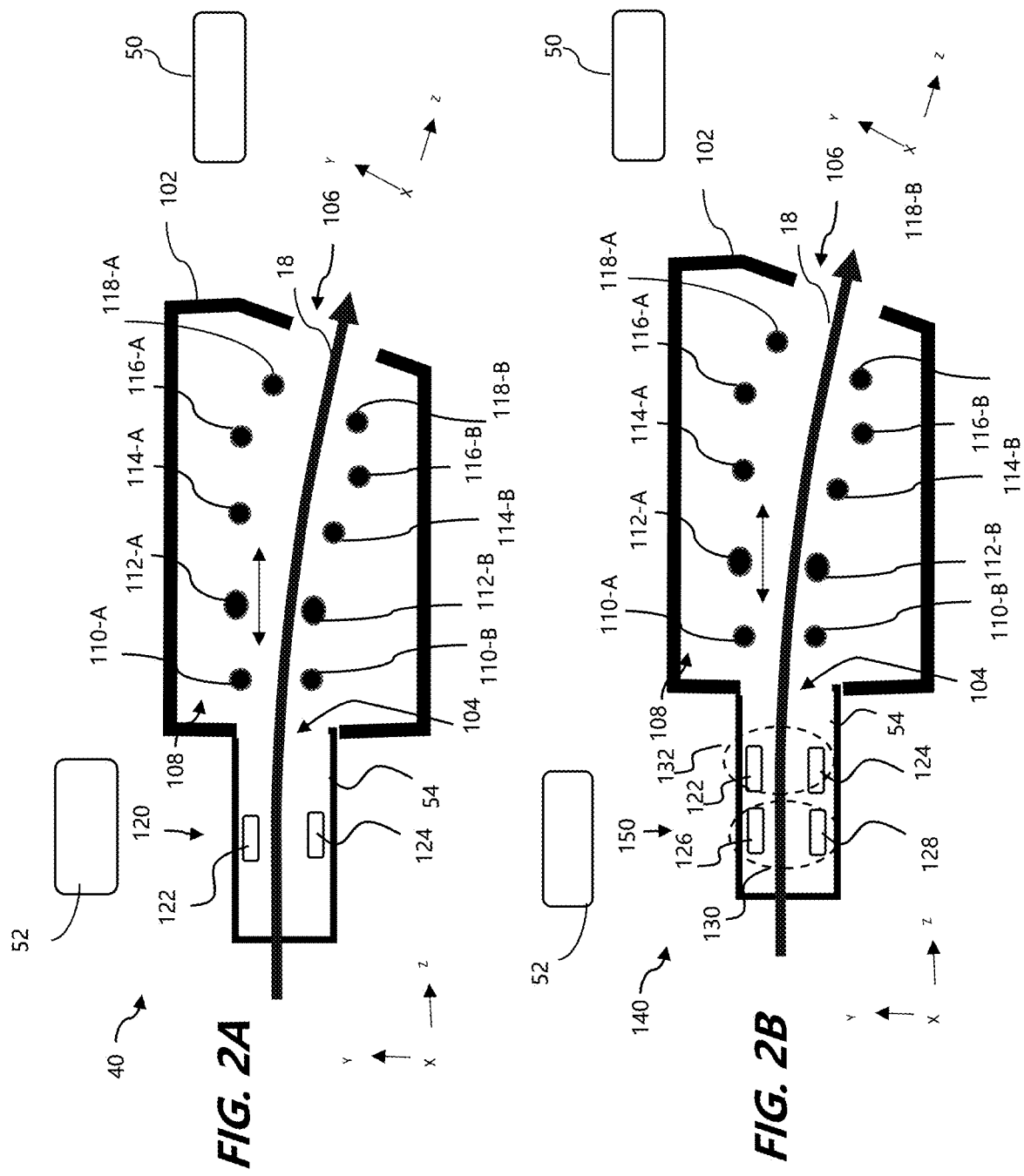

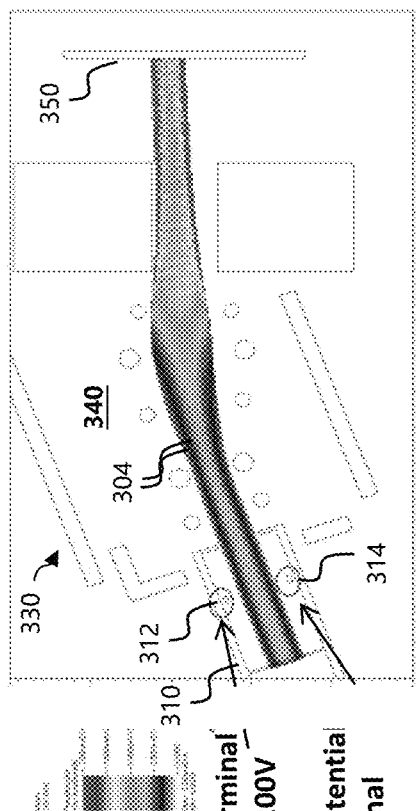
FIG. 3A
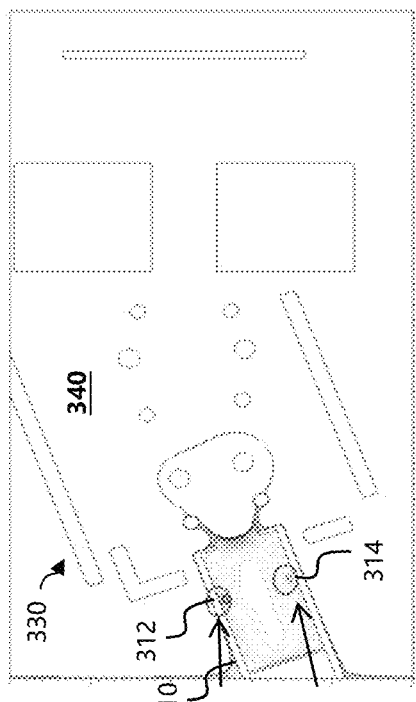
FIG. 4A
FIG. 3B
FIG. 4B

APPARATUS AND METHOD FOR CONTROLLING ION BEAM PROPERTIES USING ELECTROSTATIC FILTER

FIELD OF THE DISCLOSURE

The disclosure relates generally to techniques for implanting substrates, and more particularly, to components and techniques for improving ion beams transported through energy filters.

BACKGROUND OF THE DISCLOSURE

Ion implantation is a process of introducing dopants or impurities into a substrate via bombardment. In semiconductor manufacturing, the dopants are introduced to alter electrical, optical, or mechanical properties.

Ion implantation systems may comprise an ion source and a series of beam-line components. The ion source may comprise a chamber where ions are generated. The ion source may also comprise a power source and an extraction electrode assembly disposed near the chamber. The beamline components, may include, for example, a mass analyzer, a first acceleration or deceleration stage, a collimator, and a second acceleration or deceleration stage. Much like a series of optical lenses for manipulating a light beam, the beamline components can filter, focus, and manipulate ions or ion beam having particular species, shape, energy, and/or other qualities. The ion beam passes through the beam-line components and may be directed toward a substrate mounted on a platen or clamp. The substrate may be moved in one or more dimensions (e.g., translate, rotate, and tilt) by an apparatus, sometimes referred to as a roplat.

In many ion implanters a downstream electrostatic module, may function as an electrostatic lens to control ion beam energy, ion beam shape, and ion beam size. The electrostatic module may accelerate or decelerate an ion beam to a final energy, while altering the direction of the ion beam. By altering the direction of the ion beam, energetic neutrals may be screened out, resulting in a final beam having a well-defined energy.

Known electrostatic modules may employ, for example, multiple pairs of electrodes, such as seven upper and lower electrodes arranged in pairs, where the electrodes bound and guide an ion beam traveling therethrough. The electrodes may be arranged as rods spaced equidistant from an ion beam. The rod/electrode potentials are set to create electric fields in the electrostatic module causing the ion beam to decelerate, deflect and focus the ion beam.

The electrostatic module often is configured with suppression electrodes designed to accelerate the ion beam to a maximum negative potential in the case of positive ion beams, generating a suppression of electrons at the same time. Notably, changes in the suppression voltage applied to suppression electrodes may cause beam focusing to vary in a complex manner. Under various sets of conditions, the beam height may be controlled by varying the suppression voltage. As suppression voltage increases, beam height decreases, providing a control "knob" to adjust beam height delivered to a substrate. When overall beam energy is to be low, suppression voltage applied to the suppression electrodes may also be low.

With respect to these and other considerations, the present disclosure is provided.

BRIEF SUMMARY

In one embodiment. an apparatus may include a main chamber, where the main chamber includes an electrode assembly. The electrode assembly may include a plurality of electrodes arranged between a chamber entrance and a chamber exit of the main chamber. The apparatus may include a beam tunnel, connected to the chamber entrance, configured to conduct an ion beam to the main chamber; and an electrostatic tuner, disposed in the beam tunnel, the electrostatic tuner comprising at least one tuner electrode, independently coupled to a tuner voltage assembly.

In a further embodiment, an ion implantation system is provided. The ion implantation system may include an ion source, disposed to generate an ion beam, an upstream beamline, configured to conduct the ion beam at a beamline potential, an electrostatic filter, disposed to receive the ion beam. The electrostatic filter may include a main chamber, including a plurality of electrodes. The electrostatic filter may also include a beam tunnel, connected to the main chamber, the beam tunnel being at beamline potential and being configured to conduct the ion beam to the main chamber. The electrostatic filter may further include an electrostatic tuner, disposed in the beam tunnel, the electrostatic tuner comprising at least one tuner electrode, electrically isolated from the beam tunnel.

In an additional embodiment, a method for controlling an ion beam may include directing the ion beam through an electrode assembly of an electrostatic filter, the electrostatic filter comprising a main chamber and a beam tunnel, disposed upstream of the main chamber. The method may also include applying a tuning voltage to a tuning electrode, disposed in the beam tunnel, wherein a beam height of the ion beam is adjusted from a first beam height before the applying the tuning voltage to a second beam height, after the applying the tuning voltage.

BRIEF DESCRIPTION OF THE DRAWINGS

FIGS. 2A-2B show the structure of different electrostatic filters, according to exemplary embodiments of the disclosure;

FIG. 3A and FIG. 3B illustrate simulations of an exemplary electrostatic filter under one mode of operation, according to embodiments of the disclosure;

FIG. 4A and FIG. 4B illustrate simulations of an exemplary electrostatic filter under one mode of operation, according to other embodiments of the disclosure;

Figure 1:
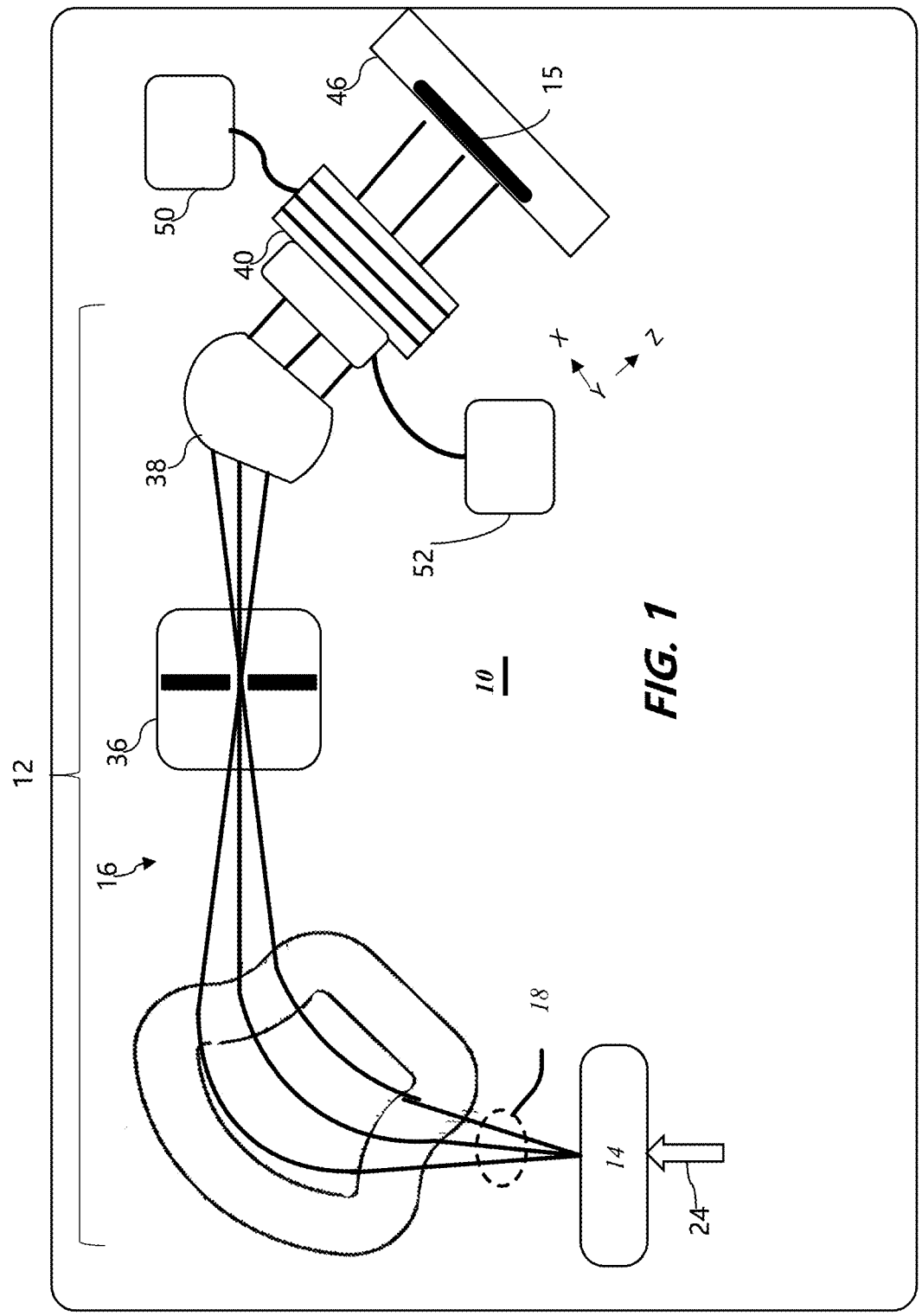
FIG. 1 shows an exemplary embodiment demonstrating an ion implantation system, according to embodiments of the disclosure.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

DETAILED DESCRIPTION

A system and method in accordance with the present disclosure will now be described more fully hereinafter with reference to the accompanying drawings, where embodiments of the system and method are shown. The system and method may be embodied in many different forms and are not be construed as being limited to the embodiments set forth herein. Instead, these embodiments are provided so this disclosure will be thorough and complete, and will fully convey the scope of the system and method to those skilled in the art.

For the sake of convenience and clarity, terms such as "top," "bottom," "upper," "lower," "vertical," "horizontal," "lateral," and "longitudinal" will be used herein to describe the relative placement and orientation of these components and their constituent parts, with respect to the geometry and orientation of a component of a semiconductor manufacturing device as appearing in the figures. The terminology will include the words specifically mentioned, derivatives thereof, and words of similar import.

As used herein, an element or operation recited in the singular and proceeded with the word "a" or "an" are understood as potentially including plural elements or operations as well. Furthermore, references to "one embodiment" of the present disclosure are not intended to be interpreted as precluding the existence of additional embodiments also incorporating the recited features.

Provided herein are approaches for improved transport and control of an ion beam at an electrostatic filter, for example. In exemplary embodiments, an electrostatic filter having a novel tuning electrode assembly is provided.

Referring now to FIG. 1, an exemplary embodiment demonstrating a system 10 is shown, where the system 10 may be used for ion implantation system in accordance with the present disclosure. The system 10 includes, among other components, an ion source 14 for producing an ion beam 18, such as a ribbon beam or a spot beam, and a series of beam-line components. The ion source 14 may comprise a chamber for receiving a flow of gas 24 and generates ions. The ion source 14 may also comprise a power source and an extraction electrode assembly disposed near the chamber. The beamline extending from the ion source 14 to an electrostatic filter 40 may be deemed an upstream beamline 12. In some non-limiting embodiments, the beam-line components 16 of the upstream beamline may include, for example, a mass analyzer 34, a first acceleration or deceleration stage 36, and a collimator 38, disposed upstream of the electrostatic filter 40, which filter may provide deceleration and/or acceleration of the ion beam 18.

In exemplary embodiments, the beam-line components 16 may filter, focus, and manipulate ions or the ion beam 18 to have a particular species, shape, energy, and/or other qualities. The ion beam 18 passing through the beam-line components 16 may be directed toward a substrate 15 mounted on a platen or clamp within a process chamber 46. The substrate may be moved in one or more dimensions (e.g., translate, rotate, and tilt).

The electrostatic filter 40 is a beam-line component configured to independently control deflection, deceleration, and focus of the ion beam 18. In some embodiments, the electrostatic filter 40 is a vertical electrostatic energy filter (VEEF) or electrostatic filter EF. As will be described in greater detail below, the electrostatic filter 40 may be arranged as an electrode assembly defining at least one electrode configuration. The electrode configuration may include a plurality of electrodes arranged in series along the beamline to process the ion beam 18 through the electrostatic filter 40. In some embodiments, the electrostatic filter may include a set of upper electrodes disposed above the ion beam 18 and a set of lower electrodes disposed below the ion beam 18. A difference in potentials between the set of upper electrodes and the set of lower electrodes may also be varied along the central ion beam trajectory to deflect the ion beam at various points along the central ray trajectory (CRT). The system 10 may further include an electrode voltage supply, shown as electrode voltage assembly 50, as well as a tuner voltage assembly 52, coupled to the electrostatic filter 40, where the operation of the tuner voltage assembly is described below.

Referring now to FIG. 2A, the structure of one variant of the electrostatic filter 40 is shown. In FIG. 2A, there is shown a side cross-sectional view the electrostatic filter 40, electrode voltage assembly 50, and tuner voltage assembly 52. As shown, the electrostatic filter 40 includes a main chamber 102, extending above and partially encasing electrostatic filter 40, leaving an entrance aperture 104 and exit aperture 106 to conduct the ion beam 18 therethrough. The electrostatic filter 40 includes electrode assembly 108, made of a plurality of electrode pairs, where a given electrode in an electrode pair is denoted by the suffix "A" for upper electrodes (electrode 110-A, electrode 112A, electrode 114A, electrode 116A, and electrode 118-A), above the ion beam 18, and denoted with the suffix "B" for lower electrodes (electrode 110-B, electrode 112B, electrode 114B, electrode 116B, and electrode 118-B). In accordance with various embodiments, the electrodes of electrode assembly 108 may be elongated along the X-axis of the Cartesian coordinate system shown. As such, the electrodes may be useful for controlling a ribbon beam having a cross-section, also elongated along the X-axis, where the ribbon beam may be tens of centimeters wide along the X-axis and may have a height on the order of several centimeters. The embodiments are not limited in this context. While shown as a series of pairs of electrodes, in other embodiments, the number of electrodes on the bottom region of the main chamber 102 may differ from the number of electrodes in the top region of the main chamber 102.

In accordance with embodiments of the disclosure, the electrostatic filter 40 may include a beam tunnel 54, connected to the chamber entrance of the main chamber 102, through the entrance aperture 104. The beam tunnel 54 may be configured to conduct the ion beam 18 to the main chamber 102, where the ion beam 18 may undergo acceleration, deceleration, filtering, focusing, deflection, and so forth.

The electrostatic filter 40 may also include an electrostatic tuner 120, disposed in the beam tunnel 54, and including at least one tuner electrode. In this embodiment and embodiments to follow the electrostatic tuner is electrically isolated from a beam tunnel to be biased independently with respect to the beam tunnel. In the embodiment of FIG. 2A, two tuner electrodes are shown, where a tuner electrode 122 is disposed above the ion beam 18, and a tuner electrode 124 is disposed below the ion beam 18. The electrostatic tuner 120 may be coupled to the tuner voltage assembly 52, where the tuner electrode 122 and the tuner electrode 124 are coupled to receive voltage separately from the electrode voltage assembly 50. In some embodiments, the tuner electrode 124 and the tuner electrode 122 may be coupled to receive the same voltage, while in other embodiments the tuner electrode 122 may be coupled to independently receive a voltage from the tuner voltage assembly 52, different from a voltage sent to the tuner electrode 124.

As detailed below, generally the electrostatic tuner 120 may be used to provide tuning voltage signals to locally manipulate electric fields and electron distributions near the entrance to the main chamber 102, affecting beam properties, such as beam shape and beam height.

While the electrostatic tuner 120 is shown having a single electrode disposed above the ion beam 18 and a single electrode disposed below the ion beam 18, in other embodiments, fewer or a greater number of electrodes may be provided, in a variety of different configurations. In some configurations, a top tuner electrode set may be provided, disposed above a beam position of the beam tunnel 54 where the ion beam 18 is conducted through the beam tunnel 54. A bottom tuner electrode set may also be provided, disposed below the beam position of the beam tunnel 54. In some configurations, the tuner electrode sets (composed of at least one tuner electrode) may be disposed in an upstream/downstream configuration (along the Z-axis) or in a lateral configuration (along the X-axis), in addition to the distribution along the Y-axis as shown in FIG. 2A.

Referring now to FIG. 2B, the structure another electrostatic filter 140 is shown. The electrostatic filter 140 shares the same components as electrostatic filter 40, having the same reference number. In addition, in the electrostatic tuner 150 of electrostatic filter 140, an upper electrode, shown as tuner electrode 126, is disposed upstream of tuner electrode 122, and a lower electrode, shown as tuner electrode 128, is disposed upstream of tuner electrode 124. In this configuration, the electrostatic tuner 150 is made of a downstream electrode set, disposed at a first position along the beam tunnel 54, and an upstream electrode set, disposed at a second position along the beam tunnel 54, upstream of the first position. In some instances, different voltages may be applied to the upstream electrode set as compared to the downstream electrode set. For example, a more negative voltage may be applied to the upstream electrode set 130, as opposed to the downstream electrode set 132.

FIG. 3A and FIG. 3B illustrate simulations of an exemplary electrostatic filter 330 under one mode of operation, according to embodiments of the disclosure. In this simulation, the beam tunnel 310 is approximately 180 mm long, directing a 50 mm tall ion beam to the main chamber 340. The ion beam 302 is a P+3 kV ion beam, having an initial ion energy of 33 keV and a final ion energy of 3 keV. The electrostatic filter in this figure and those figures to follow is arranged with an electrode assembly in the main chamber 340 composed of five pairs of electrodes, while in other embodiments, an electrode assembly may include more or fewer pairs of electrodes, may include less electrodes above the beam than below the beam, and so forth. The electrode assembly in main chamber 340 is arranged to steer, focus, and ultimately decelerate the ion beam 302, so the ion beam 302 emerges from the main chamber 340 having a targeted direction, height, parallelism, and other useful properties at the substrate 350. In various embodiments, the second pair of electrodes (from the beam tunnel 310) in the main chamber 340 may be arranged as suppression electrodes, having the most negative potential.

In the simulations of FIG. 3A and those figures to follow, the voltage applied to tuner electrodes in the beam tunnel 310 may be adjusted to adjust beam properties. In FIG. 3A, the beam tunnel 310 is set at −30 kV the upper tuner electrode 312 and lower tuner electrode 314 are set at the same potential as the beam tunnel 310. Thus, in FIG. 3A, the upper tuner electrode 312 and lower tuner electrode 314 play no role in electrically manipulating the ion beam 302. As a result, the ion beam 302 arrives at the substrate 350 with a beam height of approximately 50 mm (along the Y-axis).

FIG. 3B illustrates an electric potential diagram (voltage), showing the ion beam 302 is fully neutralized in the beam tunnel 310.

FIG. 4A and FIG. 4B illustrate simulations of the exemplary electrostatic filter 330 under another mode of operation, according to embodiments of the disclosure. In this simulation, the beam tunnel 310 is approximately 180 mm long, directing a 50 mm tall ion beam to the main chamber 340. The ion beam 304 is a P+3 kV ion beam, having an initial ion energy of 33 kV and a final ion energy of 3 kV. The beam tunnel 310 is set at −30 kV, The ion beam 304 is transported through the beam tunnel 310, while the upper tuner electrode 312 is set at a voltage +200 V higher than the voltage of the beam tunnel 310, while the lower tuner electrode 314 is set at the same potential as the beam tunnel 310. Thus, in FIG. 4A, the upper tuner electrode 312 and lower tuner electrode 314 perturb the ion beam 304 slightly. As a result, the ion beam 304 arrives at the substrate 350 with a beam height of approximately 40 mm (along the Y-axis), less than the beam height when the tuner electrodes are not biased with respect to the beam tunnel voltage.

FIG. 4B illustrates an electric potential diagram (voltage), showing the beam exhibits an increase in beam potential in the beam tunnel 310.

Figure 5A:
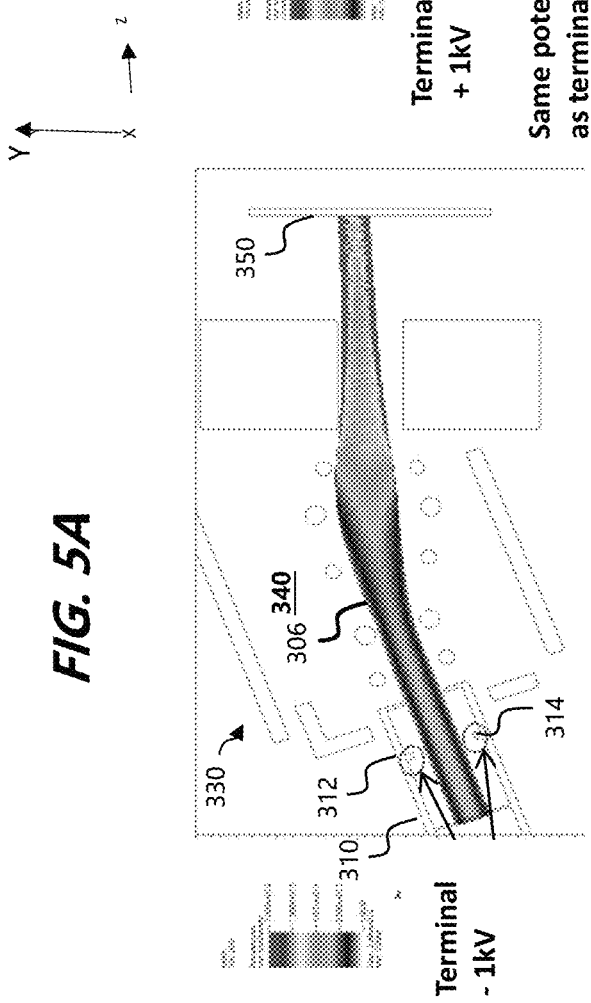
FIG. 5A and FIG. 5B illustrate simulations of an exemplary electrostatic filter under one mode of operation, according to further embodiments of the disclosure.
Figure 5B:
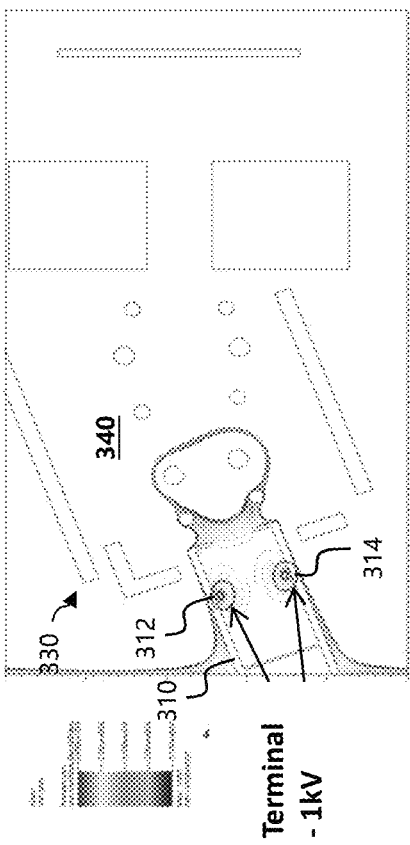

FIG. 5A and FIG. 5B illustrate simulations of an exemplary electrostatic filter 330 under one mode of operation, according to embodiments of the disclosure. In this simulation, the beam tunnel 310 is approximately 180 mm long, directing a 50 mm tall ion beam to the main chamber 340. The ion beam 306 is a P+3 kV ion beam, having an initial ion energy of 33 kV and a final ion energy of 3 kV. The beam tunnel 310 is set at −30 kV The ion beam 306 is directed through the beam tunnel 310 while the upper tuner electrode 312 and lower tuner electrode 314 are set at a potential of −1 kV with respect to the potential of the beam tunnel 310. Thus, in FIG. 5A, the upper tuner electrode 312 and lower tuner electrode 314 perturb the ion beam 306. As a result, the ion beam 304 arrives at the substrate 350 with a beam height of approximately 40 mm (along the Y-axis).

FIG. 5B illustrates an electric potential diagram (voltage), showing the ion beam 306 is locally perturbed in the beam tunnel 310.

Figure 6A:
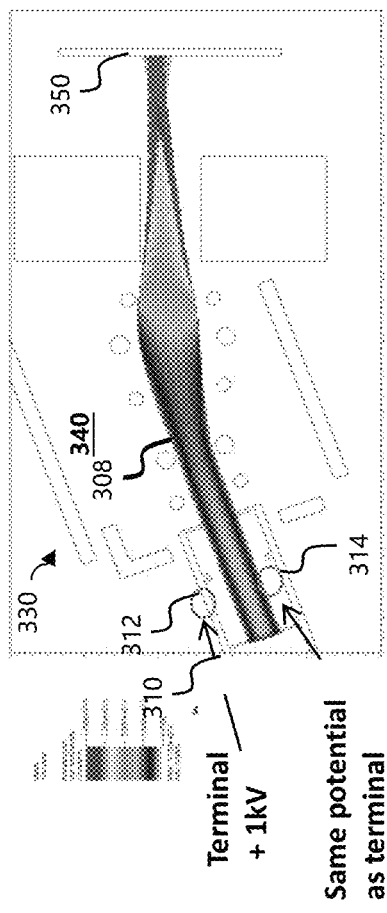
FIG. 6A and FIG. 6B illustrate simulations of an exemplary electrostatic filter under one mode of operation, according to additional embodiments of the disclosure.
Figure 6B:
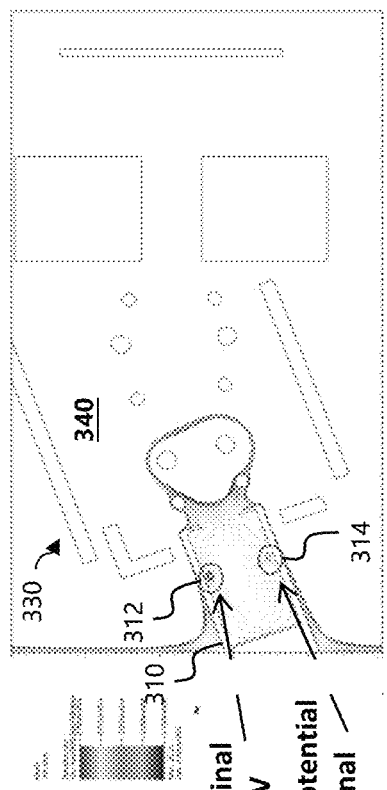

FIG. 6A and FIG. 6B illustrate simulations of the exemplary electrostatic filter 330 under a further mode of operation, according to embodiments of the disclosure. In this simulation, the beam tunnel 310 is approximately 180 mm long, directing a 50 mm tall ion beam to the main chamber 340. The ion beam 308 is a P+3 kV_ion beam, having an initial ion energy of 33 kV and a final ion energy of 3 kV. The beam tunnel 310 is set at −30 kV. The ion beam 308 is directed through the beam tunnel 310, while the upper tuner electrode 312 is set at a potential+1 kV above the potential of the beam tunnel 310, and the lower tuner electrode 314 is set at the same potential as the beam tunnel 310. Thus, in FIG. 6A, the upper tuner electrode 312 and lower tuner electrode 314 manipulate the ion beam 308 in an asymmetric fashion, as shown. As a result, the ion beam 308 arrives at the substrate 350 with a beam height of approximately 20 mm (along the Y-axis).

FIG. 6B illustrates an electric potential diagram (voltage), showing the ion beam 308 has the beam potential increased globally in the beam tunnel 310.

Thus, according to the above results, small voltage perturbations may be placed upon a tuner electrode assembly, such as less than +/−2 kV with respect to the beam tunnel potential, to adjust the height or focus of an ion beam downstream, when exiting the electrostatic filter. The voltage perturbations may be negative with respect to beam tunnel voltage, or positive with respect to beam tunnel voltage, may be symmetric, where the same voltage is applied to all tuner electrodes, or may be asymmetric, where upper tuner electrodes receive a different potential than lower tuner electrodes.

In accordance with the above results shown in FIGS. 3A-6B, the voltages applied to tuner electrodes may be used to manipulate beam height and beam focus of an ion beam in an electrostatic filter. For example, a targeted beam height may be set for a given ion beam composed of a given ion species and a final ion beam energy. The electrode potentials applied to the electrode assembly of the main chamber of the electrostatic filter may be adjusted to produce to proper beam steering, deceleration and general direction as impacting a substrate. The beam height at the substrate may then be measured and compared to the targeted beam height. As needed, a small tuner voltage may be applied and varied to at least one tuner electrode located in the beam tunnel, until the targeted beam height is reached. In this manner, the electrode voltages applied to the electrode assembly of the main chamber need not be adjusted during the beam height adjustment performed by the tuner electrodes.

Figure 7:
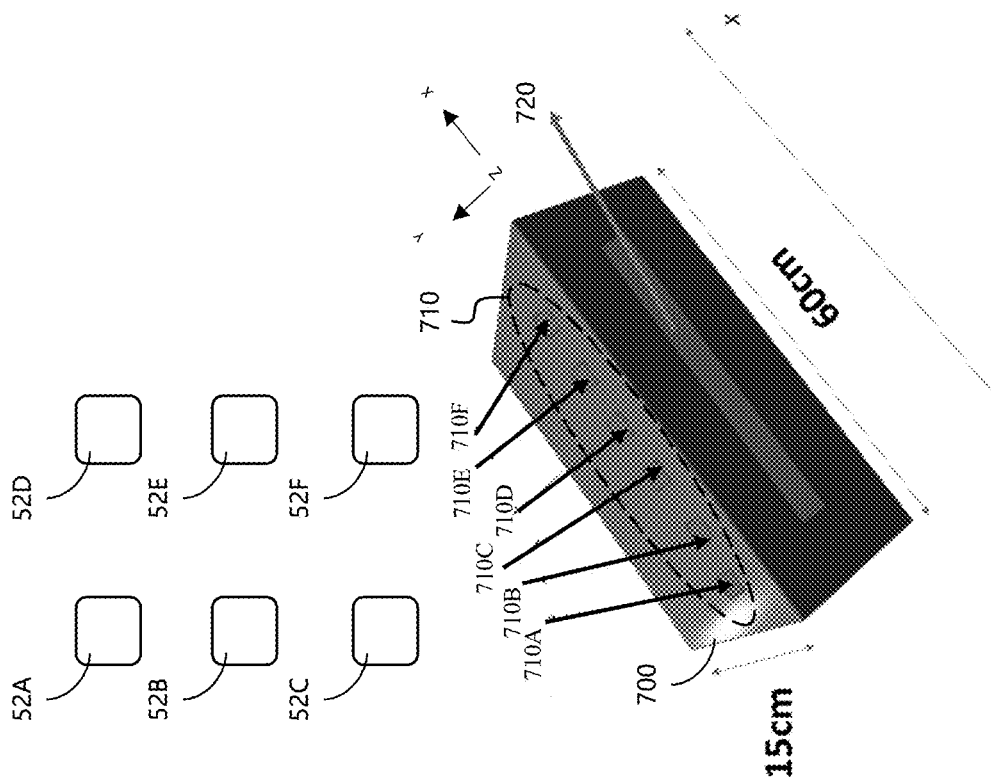
FIG. 7 shows a perspective view of a beam tunnel and electrostatic tuner, in accordance with embodiments of the disclosure.

In further embodiments of the disclosure, an electrostatic tuner may be arranged as a plurality of tuner electrodes, forming a lateral electrode set extending along a lateral direction (such as parallel to the X-axis), perpendicular to the direction of propagation of the ion beam. FIG. 7 illustrates an embodiment of a beam tunnel 700 and electrostatic tuner 710, arranged as a plurality of separate tuner electrodes, shown as tuner electrode 710A, tuner electrode 710B, tuner electrode 710C, tuner electrode 710D, tuner electrode 710E, and tuner electrode 710F. A given tuner electrode may be coupled to independently receive different voltage signals from one another. In one configuration, tuner electrode 710A, tuner electrode 710B, tuner electrode 710C, tuner electrode 710D, tuner electrode 710E, and tuner electrode 710F may be coupled to voltage supply 54*a*, voltage supply 54B, voltage supply 54C, voltage supply 54D, voltage supply 54E, and voltage supply 54F, respectively. By supplying different voltages to the different tuner electrodes of the electrostatic tuner 710, the ion beam 720 may be adjusted to improve beam height uniformity, by correcting non-uniformities so beam height at a substrate downstream is uniform along the X-axis. While not limited to any particular dimensions, the arrangement of FIG. 7 may be used to correct beam height for a ribbon beam having a width along the X-axis of 300 mm to 500 mm, for example, in a beam tunnel 700 having a width of 600 mm.

Figure 8:
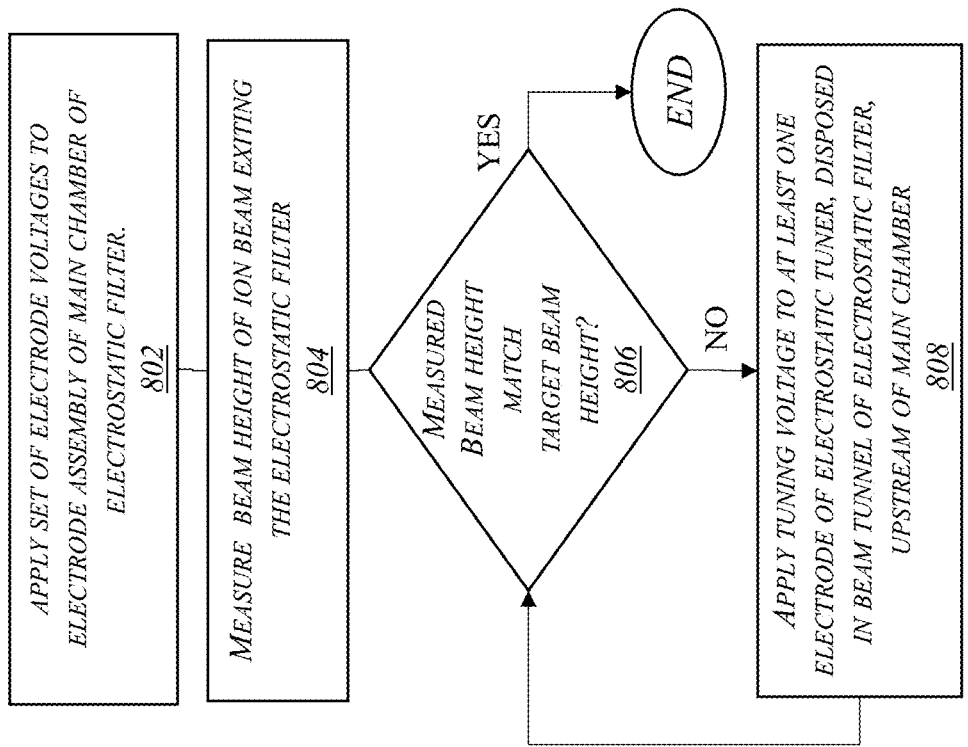
FIG. 8 depicts an exemplary process flow according to some embodiments of the disclosure.

FIG. 8 depicts an exemplary process flow 800 according to some embodiments of the disclosure. At block 802, a set of electrode voltages is applied to an electrode assembly of a main chamber of an electrostatic filter. The set of voltages may be arranged to steer an ion beam so as to deflect the direction of the ion beam, filtering out energetic neutrals. The set of voltages may also decelerate the ion beam, as well as shape and steer the ion beam to exit the electrostatic filter having a targeted beam energy, direction, and height.

At block 804, a beam height of an ion beam exiting the electrostatic filter is measured. The beam height may be measured between the electrostatic filter and a substrate position.

At block 806 a determination is made as to whether the measured beam height matches the target beam height. If so, the process ends without further adjustments to the electrostatic filter.

If, at block 806 the measured beam height does not match the targeted beam height, the flow moves to block 808.

At block 808 a tuning voltage is applied to at least one electrode of an electrostatic tuner, disposed in a beam tunnel of the electrostatic filter, upstream of the main chamber. The tuning voltage may be applied at a potential slightly negative with respect to the potential of the beam tunnel, or slightly positive with respect to the beam tunnel. In some examples, a plurality of different voltages may be applied to a respective plurality of different tuner electrodes of the electrostatic tuner. The flow then returns to block 806.

While the aforementioned embodiments may be applied to manipulate an ion beam of positive ions, in further implementations, the electrostatic filters of the present embodiments may be used to manipulate negative ion beams, with the appropriate voltage signals applied to the electrostatic tuner of the ion beam tunnel and electrode assembly of the main chamber.

In view of the foregoing, at least the following advantages are achieved by the embodiments disclosed herein. In the present embodiments, the beam height of an ion beam, such as a low energy ion beam, may be adjusted using tuner electrodes avoiding without the need to adjust suppression electrode voltage. This adjustment using tuner electrodes. avoids the need to adjust suppression voltage, especially in a voltage range where unpredictable variation in beam height takes place. Another advantage provided in some embodiments, is the ability to adjust lateral uniformity of ion beams, without changing voltage in the electrode assembly of the main chamber of the electrostatic filter. A further advantage provided by the present embodiments, is the ability to increase control of an ion beam while not changing overall footprint of the beamline, due to the incorporation of tuner electrodes in an existing beam tunnel.

The present disclosure is not to be limited in scope by the specific embodiments described herein. Indeed, other various embodiments and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, the present disclosure has been described herein in the context of a particular implementation in a particular environment for a particular purpose, yet those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

The invention claimed is:

1. An apparatus, comprising:
 a main chamber, the main chamber comprising an electrode assembly, comprising a plurality of electrodes arranged between a chamber entrance and a chamber exit of the main chamber;
 a beam tunnel, connected to the chamber entrance, configured to conduct an ion beam to the main chamber; and
 an electrostatic tuner, disposed in the beam tunnel, the electrostatic tuner comprising at least one tuner electrode independently coupled to a tuner voltage assembly, wherein the electrostatic tuner is downstream of a collimator and upstream of the main chamber.

2. The apparatus of claim 1, further comprising an electrode voltage assembly, in communication with the electrode assembly, the electrode voltage assembly being configured to independently supply voltage to the plurality of electrodes.

3. The apparatus of claim 1, wherein the electrostatic tuner comprises a plurality of tuner electrodes.

4. The apparatus of claim 1, wherein the electrostatic tuner comprises a top tuner electrode set, disposed above a beam position of the beam tunnel, and
a bottom tuner electrode set, disposed below the beam position of the beam tunnel.

5. The apparatus of claim 1, wherein the electrostatic tuner comprises a downstream electrode set, disposed at a first position along the beam tunnel,
and an upstream electrode set, disposed at a second position along the beam tunnel, upstream of the first position.

6. The apparatus of claim 1, wherein the electrostatic tuner comprises a lateral electrode set, the lateral electrode set comprising a plurality of tuner electrodes arranged along a lateral direction, perpendicular to a direction of propagation of the ion beam.

7. The apparatus of claim 6, wherein the plurality of tuner electrodes are coupled to independently receive different voltage signals from one another.

8. The apparatus of claim 1, wherein the electrode assembly comprises at least three pairs of electrodes.

9. The apparatus of claim 1, wherein the beam tunnel is electrically isolated from the electrostatic tuner.

10. An ion implantation system, comprising:
an ion source, disposed to generate an ion beam;
an upstream beamline, configured to conduct the ion beam at a beamline potential; and
an electrostatic filter, disposed to receive the ion beam, the electrostatic filter comprising:
    a main chamber, including a plurality of electrodes;
    a beam tunnel, connected to the main chamber, the beam tunnel being at beamline potential and being configured to conduct the ion beam to the main chamber; and
    an electrostatic tuner, disposed in the beam tunnel, the electrostatic tuner comprising at least one tuner electrode, electrically isolated from the beam tunnel, wherein the electrostatic tuner is downstream of a collimator and upstream of the main chamber.

11. The ion implantation system of claim 10, wherein the electrostatic tuner comprises a plurality of tuner electrodes.

12. The ion implantation system of claim 10, wherein the electrostatic tuner comprises a first electrode set, disposed above a beam position of the beam tunnel, and
a second electrode set, disposed below the beam position of the beam tunnel.

13. The ion implantation system of claim 10, wherein the electrostatic tuner comprises a first electrode set, disposed at a first position along the beam tunnel,
and a second electrode set, disposed at a second position along the beam tunnel, upstream of the first position.

14. The ion implantation system of claim 10, wherein the electrostatic tuner comprises a lateral electrode set, the lateral electrode set comprising a plurality of tuner electrodes arranged along a lateral direction, perpendicular to a direction of propagation of the ion beam.

15. The ion implantation system of claim 14, further comprising a tuner voltage assembly configured to supply a set of voltages to the lateral electrode set, independently of one another.

16. A method for controlling an ion beam, comprising:
directing the ion beam through an electrode assembly of an electrostatic filter, the electrostatic filter comprising a main chamber and a beam tunnel, disposed upstream of the main chamber; and
applying a tuning voltage to a tuning electrode, disposed in the beam tunnel, wherein a beam height of the ion beam is adjusted from a first beam height before the applying the tuning voltage to a second beam height, after the applying the tuning voltage, wherein the electrostatic tuner is downstream of a collimator and upstream of the main chamber.

17. The method of claim 16, further comprising measuring the first beam height of the ion beam after exiting the electrostatic filter, before the applying the tuning voltage.

18. The method of claim 16, wherein the electrostatic filter comprises a downstream electrode set, disposed at a first position along the beam tunnel, and an upstream electrode set, disposed at a second position along the beam tunnel, upstream of the first position, the method further comprising applying a first tuning voltage to the downstream electrode set; and applying a second tuning voltage to the upstream electrode set, the second tuning voltage being more negative than the first tuning voltage.

19. The method of claim 16, wherein the electrostatic filter comprises a lateral electrode set, the lateral electrode set comprising a plurality of tuner electrodes, arranged along a lateral direction, perpendicular to a direction of propagation of the ion beam, the method further comprising:
applying a first tuning voltage to a first tuner electrode of the plurality of tuner electrodes, and applying a second tuning voltage to a second tuner electrode of the plurality of tuner electrodes, different than the first tuning voltage, wherein a beam height uniformity of the ion beam is improved.

* * * * *